United States Patent
Yano

[11] Patent Number: 6,118,165
[45] Date of Patent: *Sep. 12, 2000

[54] PHOTODIODE AND OPTICAL TRANSMITTER-RECEIVER

[75] Inventor: Shinji Yano, Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/048,109

[22] Filed: Mar. 26, 1998

[30] Foreign Application Priority Data

Mar. 28, 1997 [JP] Japan .................................. 9-077480

[51] Int. Cl.[7] .................. H01L 31/0232; H01L 31/00
[52] U.S. Cl. .................................. 257/436; 257/461
[58] Field of Search .................................. 257/433, 461, 257/434, 436, 432, 458

[56] References Cited

U.S. PATENT DOCUMENTS

| | | | |
|---|---|---|---|
| 4,241,358 | 12/1980 | Wade | 257/461 |
| 5,128,729 | 7/1992 | Alonas et al. | 257/433 |
| 5,130,531 | 7/1992 | Ito et al. | 257/432 |
| 5,291,038 | 3/1994 | Hanamoto et al. | 257/433 |
| 5,767,538 | 6/1998 | Mullins et al. | 257/461 |
| 5,903,021 | 5/1999 | Lee et al. | 257/233 |

FOREIGN PATENT DOCUMENTS

| | | | |
|---|---|---|---|
| 3-94478 | 4/1991 | Japan | 257/458 |
| 4-280674 | 10/1992 | Japan | 257/461 |
| 4-280685 | 10/1992 | Japan | 257/461 |

*Primary Examiner*—Donald L. Monin, Jr.
*Attorney, Agent, or Firm*—Arent Fox Kintner Plotkin & Kahn PLLC

[57] ABSTRACT

A photodiode that is less susceptible to electromagnetic noise without a shield case is produced by forming an n-type layer on a p-type substrate serving as a first p-type layer, separating the n-type layer from side edges by providing a p-type separation strip around the n-type layer, forming a second p-type layer on the n-type layer with part of the latter left uncovered, and coating the entire surface with a protective film layer. On the protective film layer, a first and a second electrode are provided, and, through an opening formed in the protective film layer, the first electrode is connected to the n-type layer and the second electrode is connected to the p-type separation strip and to the second p-type layer. The second electrode is connected to the ground level so that the first and second p-type layers are kept at the ground level, whereas the electric charge produced through photoelectric conversion is fed out from the first electrode. The second p-type layer, connected to the ground level and thus having a low impedance, serves as a shield that shuts out electromagnetic noise from the surface.

20 Claims, 4 Drawing Sheets

PHOTODIODE AND OPTICAL TRANSMITTER-RECEIVER

BACKGROUND OF THE INVENTION

1. Field of the Invention

The present invention relates to a photodiode that is used as a light-sensitive device, and more particularly to a photodiode that is less affected by electromagnetic noise, and also to an optical transmitter-receiver employing such a photodiode.

2. Description of the Prior Art

Photodiodes, which receive light and convert it into an electric signal, are widely used as light-sensitive devices in remote-control, optical-communications, and other equipment. Conventionally, as shown in FIG. 7, a photodiode is produced by forming an n-type layer 52 on a p-type substrate 51, with the bottom surface of the p-type substrate 51 die-bonded with silver paste 53 or the like to a frame 54 that is connected to the ground level. Accordingly, this photodiode has its anode 56 on the frame side, and has its cathode 55 on the chip-surface side where it receives light.

The light incident on the chip surface is then, at the junction surface between the n-type layer 52 and the p-type substrate 51, subjected to photoelectric conversion, and the resulting electric charge appears at the cathode 55 as a signal that indicates the amount of light received. As shown in FIG. 8, the cathode 55 is connected to a signal processing circuit 9 so that the feeble signal obtained from the cathode is first amplified and then subjected to processing that varies from application to application.

Inconveniently, however, in the above photodiode, the cathode realized as the chip surface has a high impedance, and is therefore susceptible to electromagnetic noise that is emitted from a picture tube, computer, or other component included in the equipment in which the photodiode is employed. As a result, the photodiode tends to output false signals. A false signal causes malfunction of the signal processing circuit, and thereby leads to serious problems such as failure in remote control and corrupt information in optical communication.

To avoid such problems, it has been customary to enclose a photodiode in a shield case made of metal so that the shield case shuts out electromagnetic noise and thereby prevents the photodiode from generating false signals. However, enclosing a photodiode in a shield case not only makes the photodiode larger, but also increases the number of components required and thus increases manufacturing cost as well as manufacturing steps. In addition, even though the use of a shield case is an effective way to shut out electromagnetic noise, it does not provide a fundamental solution to the annoying susceptibility of a photodiode to electromagnetic noise.

SUMMARY OF THE INVENTION

An object of the present invention is to provide a photodiode that is so constructed as to be less susceptible than ever to electromagnetic noise and that therefore does not require a shield case. Another object of the present invention is to provide an optical transmitter-receiver employing such a photodiode.

To achieve the above object, according to the present invention, in a photodiode having a first p-type layer connected to a ground level and an n-type layer formed on top of the first p-type layer, wherein the photodiode receives light from its n-type layer side and outputs from its n-type layer an electric charge obtained as a result of photoelectric conversion of the received light, a second p-type layer is provided on top of the n-type layer, and the second p-type layer is connected to the ground level.

The light incident on the second p-type layer is then subjected to photoelectric conversion at the junction surface between the second p-type layer and the n-type layer, and also at the junction surface between the n-type layer and the first p-type layer. The electric charge produced through photoelectric conversion is fed out from the n-type layer. The second p-type layer, which is provided on top of this n-type layer, is connected to the ground level and thus has a low impedance. As a result, the second p-type layer serves as a shield that shuts out electromagnetic noise that comes from outside. This prevents electromagnetic noise from reaching the n-type layer, and thereby prevents the n-type layer from outputting an electric charge resulting from noise.

In this photodiode, it is possible to provide an electrode for outputting the electric charge from the n-type layer and an electrode for connecting the first and second p-type layers to the ground level both on an n-type layer side surface. This means providing the anode and cathode electrodes both on one surface of the photodiode.

Alternatively, it is also possible to provide an electrode for outputting the electric charge from the n-type layer on an n-type layer side surface, and an electrode for connecting the first and second p-type layers to the ground level on a surface of the first p-type layer. Moreover, the photodiode may be so constructed that the first and second p-type layers are connected to each other within the photodiode.

By sealing in a photodiode as described above together with a light-emitting diode in light-permeable resin, it is possible to obtain an optical receiver-transmitter that is compact and operates stably.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
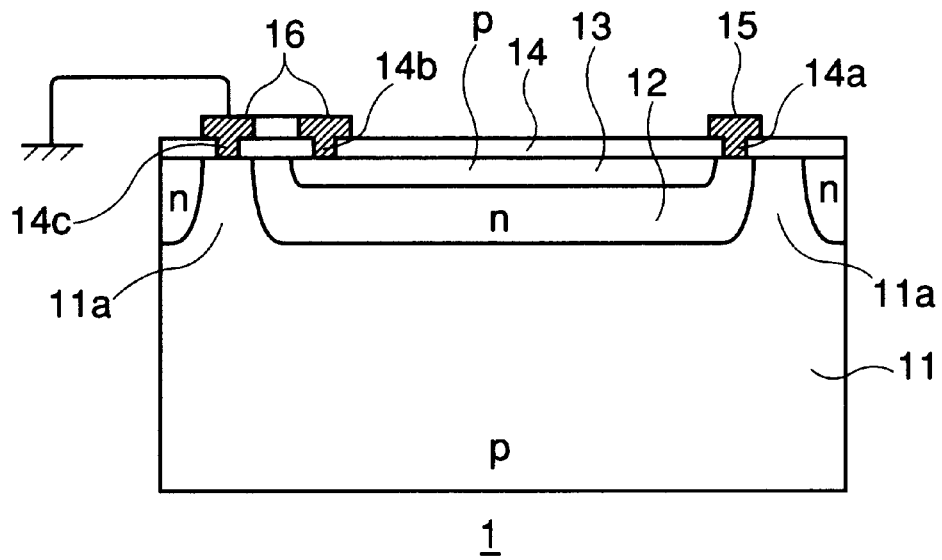
FIG. 1 is a sectional view of the photodiode of a first embodiment of the invention, schematically showing its construction.
Figure 2:
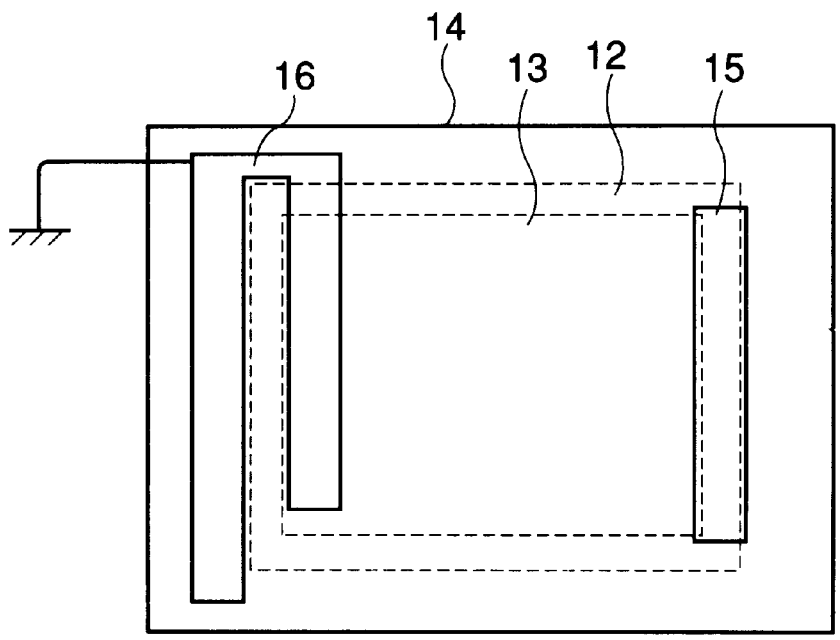
FIG. 2 is a plan view of the photodiode of the first embodiment, schematically showing its construction.

Hereinafter, embodiments of the present invention will be described with reference to the drawings. FIG. 1 shows a section of the chip constituting the photodiode 1 of a first embodiment of the invention, and FIG. 2 shows a plan view of the same chip. The photodiode 1 consists of a first p-type layer 11, an n-type layer 12, a second p-type layer 13, a protective film layer 14, and two electrodes 15 and 16.

The n-type layer 12 is formed through epitaxial growth on top of a p-type Si substrate that serves as the first p-type layer 11, and is separated from the side edges of the chip by a p-type strip 11a that is formed through diffusion of p-type impurity around the n-type layer 12. The second p-type layer 13 is formed by implanting ions to the n-type layer 12, and is provided on top of the n-type layer 12 except over the peripheral part thereof.

The protective film layer 14 is made of $SiO_2$ or SiN, and is so provided as to cover the entire top surface of the chip. In the protective film layer 14 are formed an opening 14a for exposing the n-type layer 12, an opening 14b for exposing the second p-type layer 13, and an opening 14c for exposing the p-type strip 11a each in a strip-like shape.

The electrode 15 is provided over the opening 14a, and is connected to the n-type layer 12. The electrode 16 is provided over the openings 14b and 14c, and is connected to the second p-type layer 13 and also, via the p-type strip 11a, to the first p-type layer 11. The electrode 16 is connected to the ground level. As a result, the first and second p-type layers 11 and 13 are both kept at the ground level.

The photodiode 1 receives light from its chip-surface side where the protective film layer 14 is provided. The light passes through the protective film layer 14, and is then subjected to photoelectric conversion at the junction surface between the second p-type layer 13 and the n-type layer 12 and also at the junction surface between the n-type layer 12 and the first p-type layer 11. The electric charge produced through photoelectric conversion is fed out from the n-type layer 12 to the electrode 15.

In this construction, the electrode 15 serves as the cathode, and the electrode 16 serves as the anode. The electrode 15 is connected to a signal processing circuit that is not shown in the figure, so that the output signal fed out from the electrode 15, which indicates the amount of light the photodiode 1 is receiving, is first amplified by the signal processing circuit and then subjected to whatever processing suits the purpose for which the equipment that employs the photodiode 1 is intended.

Even if another component within the equipment emits electromagnetic noise and it enters the photodiode 1 through the chip surface, since the second p-type layer 13 is connected to the ground level and thus has a low impedance, the electromagnetic noise is shut out by the second p-type layer 13. Accordingly, electromagnetic noise never reaches the n-type layer 12, and thus it never occurs that an electric charge resulting from extraneous electromagnetic noise appears at the electrode 15. This makes it possible to keep the signal processing circuit operating normally at all times, and thereby greatly enhance the reliability of the equipment that employs the photodiode 1.

The second p-type layer 13 performs a function similar to the shield case that has conventionally been used. That is, the photodiode 1 incorporates a construction that shuts out electromagnetic noise, and therefore it operates stably even if it is not enclosed in a shield case. Thus, the photodiode 1 can be used by itself.

In this embodiment, the opening 14b in the protective film layer 14 is so shaped as to extend along one side of the second p-type layer 13 so that the second p-type layer 13 is connected to the electrode 16 along a line. However, it is also possible to form the opening 14b along four sides of the second p-type layer 13 so that the second p-type layer 13 is surrounded by the electrode 16. This helps keep the entire area of the second p-type layer 13 uniformly at the ground level and thereby enhance the efficiency with which electromagnetic noise is shut out.

Figure 3:
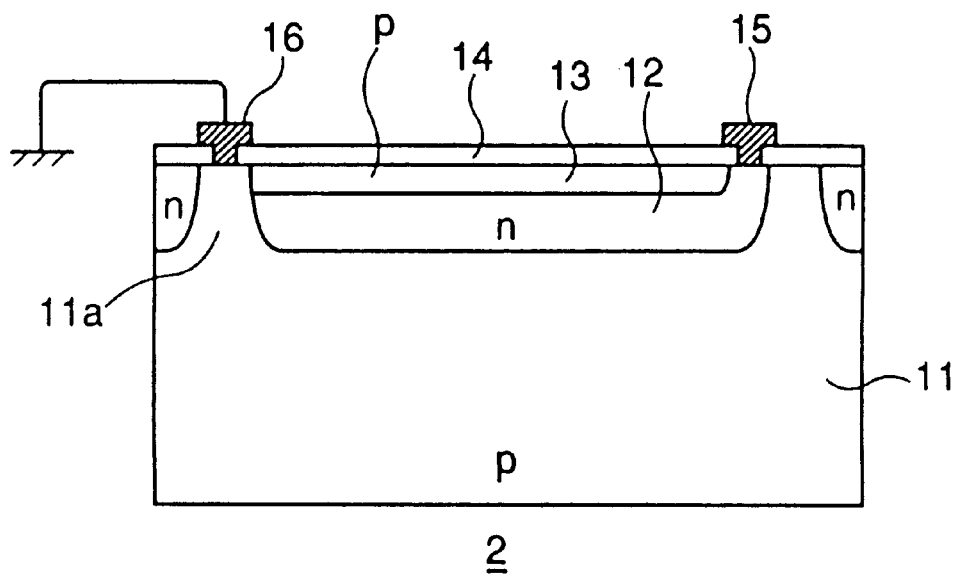
FIG. 3 is a sectional view of the photodiode of a second embodiment of the invention, schematically showing its construction.

FIG. 3 shows a section of the photodiode of a second embodiment. This photodiode 2 has the second p-type layer 13 and the p-type strip 11a connected to each other within the photodiode, and instead lacks the opening 14b that is formed in the protective film layer 14 to connect the second p-type layer 13 and the electrode 16 in the first embodiment. Here, the second p-type layer 13 is, just as the first p-type layer 11, connected via the p-type strip 11a to the electrode 16. In other respects, the photodiode 2 is constructed in the same manner as the photodiode 1, and therefore overlapping explanations will not be repeated.

Figure 4:
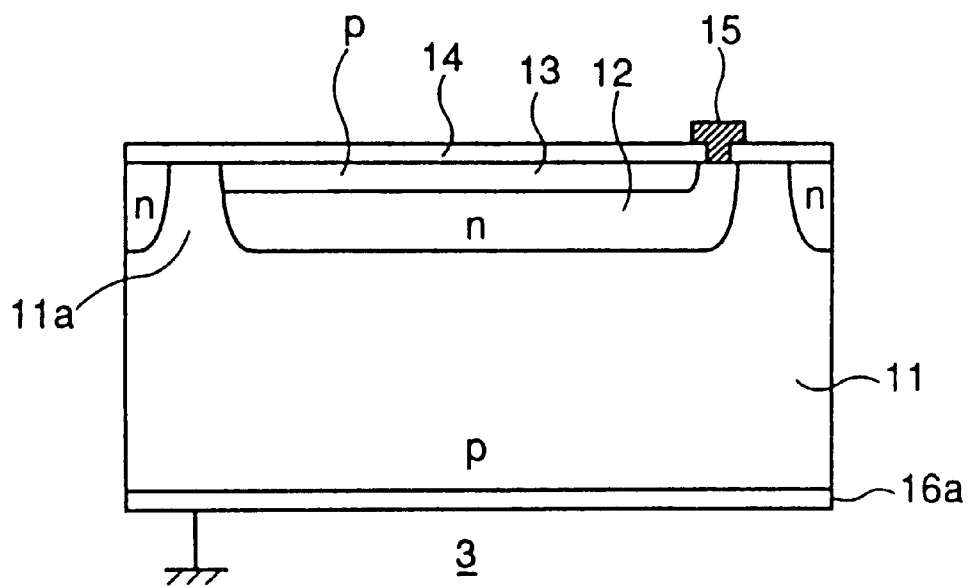
FIG. 4 is a sectional view of the photodiode of a third embodiment of the invention, schematically showing its construction.

FIG. 4 shows a section of the photodiode of a third embodiment. This photodiode 3 has the second p-type layer 13 and the p-type strip 11a connected to each other within the photodiode, and has the first p-type layer 11 connected via an electrode 16a provided on the bottom surface thereof to the ground level. Thus, the second p-type layer 13 is connected via the p-type strip 11a and the first p-type layer 11 to the ground level.

Instead, this photodiode 3 lacks the two openings 14b and 14c in the protective film layer 14 and the electrode 16 that are found in the photodiode 1 of the first embodiment. This photodiode 3 is die-bonded with silver paste or the like to a frame. In other respects, the photodiode 3 is constructed in the same manner as the photodiode 1, and therefore overlapping explanations will not be repeated.

Note that, in the photodiodes 2 and 3 of the second and third embodiments, it is preferable to form the second p-type layer 13 over the entire area of the n-type layer 12 except over a side-edge part thereof that should be left uncovered for the connection to the electrode 15. By so doing, the second p-type layer 13 is connected to the p-type strip 11a along three side edges. This helps keep the entire area of the second p-type layer 13 uniformly at the ground level and thereby enhance the efficiency with which electromagnetic noise is shut out. In addition, this helps cover the entire area of the n-type layer 12 with the second p-type layer 13 or the electrode 15 and thereby shut out electromagnetic noise more thoroughly.

Figure 5A:
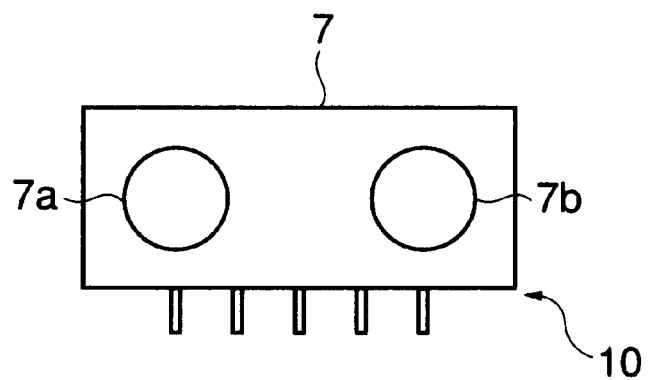
FIG. 5A is a front view of the optical transmitter-receiver of a fourth embodiment of the invention.
Figure 5B:
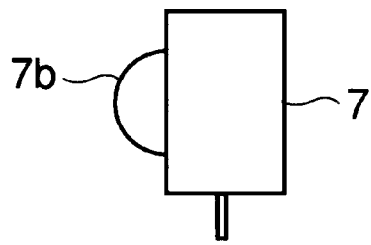
FIG. 5B is a side view of the optical transmitter-receiver of the fourth embodiment.
Figure 6:
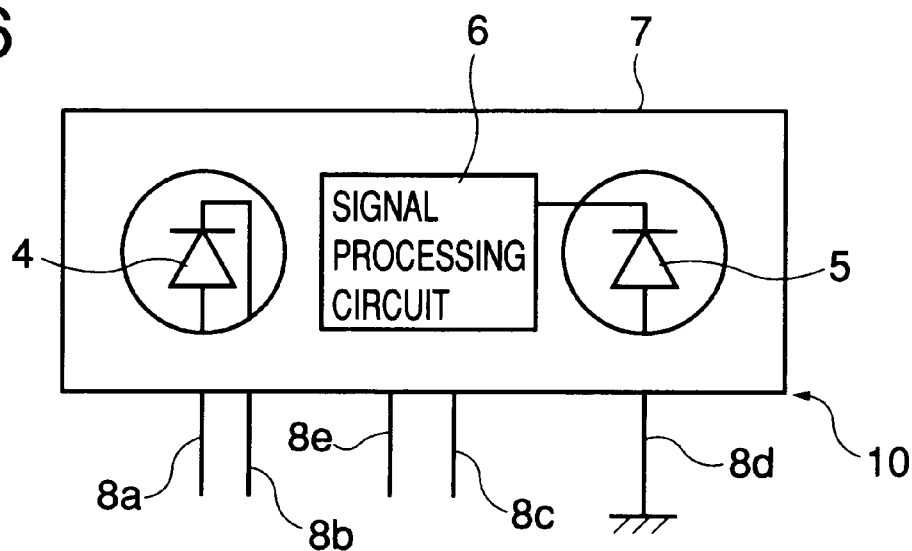
FIG. 6 is a diagram schematically showing the internal construction of the optical transmitter-receiver of the fourth embodiment.
Figure 7:
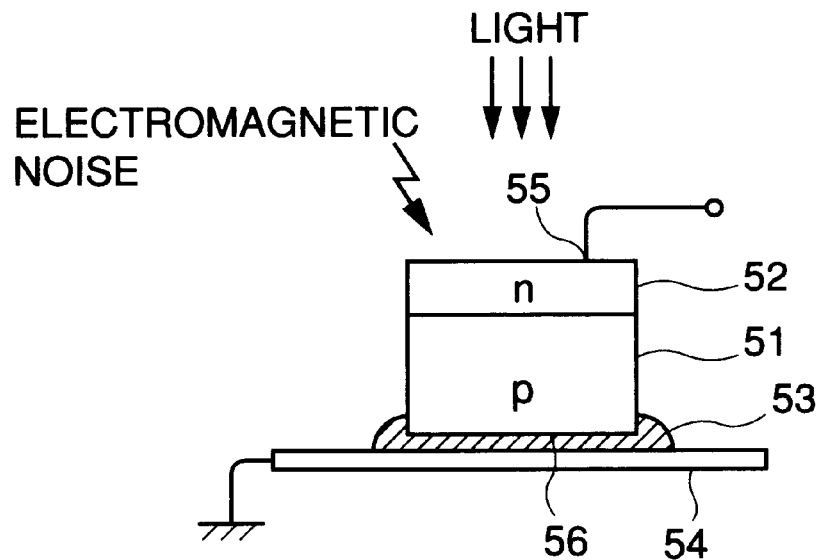
FIG. 7 is a diagram schematically showing the construction of a conventional photodiode.
Figure 8:
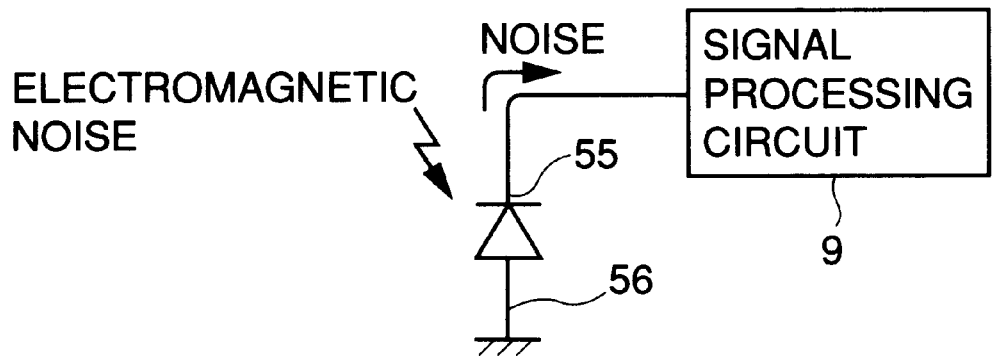
FIG. 8 is a diagram showing how the conventional photodiode is connected to a circuit that processes its output signal.

Next, the optical transmitter-receiver of a fourth embodiment of the invention will be described. FIGS. 5A and 5B respectively show a front view and a side view of the transmitter-receiver 10 of the fourth embodiment, and FIG. 6 schematically shows its internal construction. The transmitter-receiver 10 consists of a light-emitting diode 4 that emits light in the infrared region to achieve transmission, a photodiode 5 that receives light of the same wavelength band and subject it to photoelectric conversion to achieve reception, a signal processing circuit 6 that processes the output signal of the photodiode 5, and a resin mold 7, made of infrared-light-permeable epoxy resin, that seals in those three components.

As the light-emitting diode 4, a conventional one is used. As the photodiode 5, one of the photodiodes 1, 2, and 3 of the already-described embodiments is used.

In the resin mold 7, the light-emitting diode 4 and the photodiode 5 are so arranged that their light-emitting and light-receiving surfaces point in the same direction. Moreover, the resin mold 7 is so shaped as to have spherical surfaces in its portions 7a and 7b that cover respectively the light-emitting surface of the light-emitting diode 4 and the light-receiving surface of the photodiode 5. The light emitted from the light-emitting diode 4 is first made into a beam having a predetermined divergence angle by the portion 7a that serves as a convex lens; then, the light is passed to a target device. On the other hand, the light received from the target device is first condensed by the portion 7b that serves as a convex lens; then, the light is shone onto the light-receiving surface of the photodiode 5. The portion 7b, serving as a convex lens, permits the photodiode 5 to receive not only light that comes in straight, but light that comes in at an angle.

The light-emitting diode 4 is driven by a driver circuit (not shown) provided outside, and, to supply electric power from this drive circuit, the transmitter-receiver 10 is fitted with terminals 8a and 8b. The signal that the photodiode 5 outputs at its electrode 15 is first amplified and reshaped by the signal processing circuit 6, and is then fed out. The transmitter-receiver 10 is further fitted with a terminal 8c for supplying electric power to the signal processing circuit 6, a terminal 8d for connection to the ground level, and an output terminal 8e for feeding out the received signal after amplification and reshaping.

The chip of the photodiode 5 having a layer for shutting out electromagnetic noise is, as it is, sealed in in a resin mold together with the chip of the light-emitting diode 4 and that of the signal processing circuit 6. Accordingly, the transmitter-receiver 10 formed in this way does not have a shield case. As a result, this transmitter-receiver 10 is more compact than ever, and thus it is easy to mount and occupies less space than ever on a circuit board. In addition, the photodiode 5 operates highly reliably in terms of its output signal, and thus allows the gain to be set considerably high for the detection of a feeble received signal. As a result, the transmitter-receiver 10 is suitable not only as a transmitter-receiver for data communication, but also as a transmitter-receiver for remote control.

Furthermore, since the connection between the electrode 15 of the photodiode 5 and the signal processing circuit 6 requires only a short wire that is provided within the resin mold 7, it is possible to prevent a feeble received signal from being affected by extraneous noise. This makes the transmitter-receiver 10 even less susceptible to noise.

The transmitter-receiver can perform both transmission and reception; it is so controlled that, during transmission, the output signal from the terminal 8e is ignored, and that, during reception, the light-emitting diode 4 is kept inactive. By performing transmission and reception separately in this way, it is possible to prevent the photodiode 5 from receiving the light from the light-emitting diode 4 and thus prevent the transmitter-receiver 10 from erroneously recognizing a signal that it itself has transmitted as a received signal. In addition, it is possible to securely prevent the intervention of the light that the transmitter-receiver 10 itself has emitted with the light from a target device and thus prevent the corruption of the received signal.

Obviously, many modifications and variations of the present invention are possible in light of the above teachings. It is therefore to be understood that within the scope of the appended claims, the invention may be practiced other than as specifically described.

What is claimed is:

1. A photodiode comprising:

a first p-type layer connected to a ground level; and an n-type layer formed as a well layer in a top of said first p-type layer, said photodiode receiving light from a top side of said first p-type layer and outputting from said n-type layer an electric charge obtained as a result of photoelectric conversion of the received light, wherein a second p-type layer is provided as a well layer in a top of said n-type layer, said second p-type layer being connected within the photodiode to said first p-type layer so as to be connected to the ground level, and wherein an electrode for outputting the electric charge from said n-type layer is provided on an n-the layer side surface and an electrode for connecting said first and second p-type layers to the ground level is provided on a surface at the top side of said first p-type layer.

2. A photodiode as claimed in claim 1, wherein said first and second p-type layers are connected to each other along a side surface of the photodiode.

3. An optical transmitter-receiver produced by sealing in a photodiode as claimed in claim 1 and a light-emitting diode in light-permeable resin.

4. An optical transmitter-receiver as claimed in claim 3, wherein those portions of said resin that face a light-receiving surface of said photodiode and a light-emitting surface of said light-emitting diode are each shaped like a convex lens.

5. An optical transmitter-receiver as claimed in claim 3, wherein a signal processing circuit for amplifying and reshaping an output signal of said photodiode is provided within said resin.

6. A photodiode comprising:

a first p-type layer connected to a ground level; and an n-type layer formed as a well layer in a top of said first p-type layer, said photodiode receiving light from a top side of said first p-type layer and outputting from said n-type layer an electric charge obtained as a result of photoelectric conversion of the received light, wherein a second p-type layer is provided as a well layer in a top of said n-type layer, said second p-type layer being connected within the photodiode to said first p-type layer so as to be connected to the ground level, and wherein an electrode for outputting the electric charge from said n-type layer is provided on an n-type layer side surface, and an electrode for connecting said first and second p-type layers to the ground level is provided on a surface at a bottom side of said first p-type layer.

7. A photodiode as claimed in claim 6, wherein said first and second p-type layers are connected to each other along a side surface of the photodiode.

8. An optical transmitter-receiver produced by sealing in a photodiode as claimed in claim 6 and a light-emitting diode in light-permeable resin.

9. An optical transmitter-receiver as claimed in claim 8, wherein those portions of said resin that face a light-receiving surface of said photodiode and a light-emitting surface of said light-emitting diode are each shaped like a convex lens.

10. An optical transmitter-receiver as claimed in claim 8, wherein a signal processing circuit for amplifying and reshaping an output signal of said photodiode is provided within said resin.

11. A photodiode comprising:

a first p-type layer connected to a ground level; and an n-type layer formed as a well layer in a top of said first p-type layer, said photodiode receiving light from a top side of said first p-type layer and outputting from said n-type layer an electric charge obtained as a result of photoelectric conversion of the received light, wherein a second p-type layer is provided as a well layer in a top of said n-type layer, said second p-type layer being connected to the ground level, wherein a protection layer is provided over said first p-type layer, said n-type layer and said second p-type layer, said protection layer being in direct contact with said second p-type layer without any layer therebetween, and wherein an electrode for outputting the electric charge from said n-type layer is provided on an n-type layer side surface, and an electrode for connecting said first and second p-type layers to the ground level is provided on a surface at the top side of said first p-type layer.

12. A photodiode as claimed in claim 11, wherein said first and second p-type layers are connected to each other along a side surface of the photodiode.

13. An optical transmitter-receiver produced by sealing in a photodiode as claimed in claim 11 and a light-emitting diode in light-permeable resin.

14. An optical transmitter-receiver as claimed in claim 13, wherein those portions of said resin that face a light-receiving surface of said photodiode and a light-emitting surface of said light-emitting diode are each shaped like a convex lens.

15. An optical transmitter-receiver as claimed in claim 13, wherein a signal processing circuit for amplifying and reshaping an output signal of said photodiode is provided within said resin.

16. A photodiode comprising:

a first p-type layer connected to a ground level; and an n-type layer formed as a well layer in a top of said first p-type layer, said photodiode receiving light from a top side of said first p-type layer and outputting from said n-type layer an electric charge obtained as a result of photoelectric conversion of the received light, wherein a second p-type layer is provided as a well layer in a top of said n-type layer, said second p-type layer being connected to the ground level, wherein a protection layer is provided over said first p-type layer, said n-type layer and said second p-type layer, said protection layer being in direct contact with said second p-type layer without any layer therebetween, and wherein an electrode for outputting the electric charge from said n-type layer is provided on an n-type layer side surface, and an electrode for connecting said first and second p-type layers to the ground level is provided on a surface at a bottom side of said first p-type layer.

17. A photodiode as claimed in claim 16, wherein said first and second p-type layers are connected to each other along a side surface of the photodiode.

18. An optical transmitter-receiver produced by sealing in a photodiode as claimed in claim 16 and a light-emitting diode in light-permeable resin.

19. An optical transmitter-receiver as claimed in claim 18, wherein those portions of said resin that face a light-receiving surface of said photodiode and a light-emitting surface of said light-emitting diode are each shaped like a convex lens.

20. An optical transmitter-receiver as claimed in claim 18, wherein a signal processing circuit for amplifying and reshaping an output signal of said photodiode is provided within said resin.

* * * * *

UNITED STATES PATENT AND TRADEMARK OFFICE
CERTIFICATE OF CORRECTION

PATENT NO. : 6,118,165
DATED : September 12, 2000
INVENTOR(S) : Yano

It is certified that error appears in the above-identified patent and that said Letters Patent is hereby corrected as shown below:

Column 6,
Line 10-11, delete "is provided on an n-the layer side surface"
Line 12, delete "is" and insert -- are --
Line 43-44, delete "an n-type layer side" and insert -- a --
Line 44, after "surface" insert -- at the top side of said first p-type layer --

Column 7,
Line 12-13, delete "is provided on an n-type layer side surface"
Line 14, delete "is" and insert -- are --

Column 8,
Line 14-15, delete "an n-type layer side" and insert -- a --
Line 15, after "surface" insert -- at the top side of said first p-type layer --

Signed and Sealed this

Fifth Day of February, 2002

*Attest:*

JAMES E. ROGAN
*Director of the United States Patent and Trademark Office*

*Attesting Officer*